United States Patent [19]

Henderson

[11] 4,181,916
[45] Jan. 1, 1980

[54] LIQUID CRYSTAL CHANNEL NUMBER DISPLAY RESPONSIVE TO AMBIENT LIGHT LEVEL

[75] Inventor: John G. N. Henderson, Princeton, N.J.

[73] Assignee: RCA Corporation, New York, N.Y.

[21] Appl. No.: 890,883

[22] Filed: Mar. 27, 1978

[51] Int. Cl.² .................... H04N 9/535; H04N 5/58
[52] U.S. Cl. .................... 358/27; 358/161; 358/192
[58] Field of Search .................... 358/192, 161, 21, 27, 358/39, 191; 325/455, 464, 465, 406; 58/50 R, 23 C, 23 A; 340/336

[56] References Cited

U.S. PATENT DOCUMENTS

| | | | |
|---|---|---|---|
| 3,747,322 | 7/1973 | Eckenrode | 58/50 R |
| 3,753,119 | 8/1973 | Close | 325/455 |
| 3,961,361 | 6/1976 | Avins et al. | 358/27 |
| 4,051,664 | 10/1977 | Ishikawa | 58/50 R |

OTHER PUBLICATIONS

Mostek, Mos Clock Radio Circuit, MK50380n, Jan. 1975, 7 pages.

*Primary Examiner*—John C. Martin
*Attorney, Agent, or Firm*—Eugene M. Whitacre; Paul J. Rasmussen; Peter M. Emanuel

[57] ABSTRACT

The channel number display apparatus for a television receiver includes a liquid crystal device. A lamp is positioned with respect to the liquid crystal display device to selectively illuminate it under low ambient light conditions. The lamp is automatically turned on in response to a signal generated by an ambient light sensing circuit which is also utilized to control the contrast and color level characteristics of the receiver in response to ambient light conditions.

8 Claims, 2 Drawing Figures

LIQUID CRYSTAL CHANNEL NUMBER DISPLAY RESPONSIVE TO AMBIENT LIGHT LEVEL

BACKGROUND OF THE INVENTION

The present invention is directed to the field of channel display systems.

Conventional mechanical tuning systems for television receivers employ a rotary switch or turret for selecting one of a plurality of tuned circuits corresponding to respective channels. In these tuning systems, the number of a selected channel is indicated by the position of the turret. Newer digital type tuners include logic circuitry for generating binary signals representing the channel number of a selected channel. A tuning voltage for controlling the frequency of a voltage controlled oscillator is generated in response to the coded binary signals. In addition, since unlike its mechanical counterpart there is no mechanical indication corresponding to the channel selection, the binary signals are processed by a digital type channel number display apparatus to display the channel number.

Various digital channel number display systems are known for displaying channel numbers in response to binary signals. So called "on-screen" display systems control the video signal processing and deflection apparatus of the television receiver in response to the binary signal to display the channel number on the screen of the receiver. Seven segment light emitting diode (LED) and liquid crystal display systems include an array of seven bar segments arranged to form the number 8 for each digit of the channel number. The bar segments of each array are selectively enabled to form each digit of the channel number in response to the binary signals. While on-screen channel number display systems may generate relatively large numbers and provide adequate visibility under varying conditions of ambient light, they tend to be relatively complex and expensive and, by their very nature, tend to obscure, at least temporarily, a portion of the normal display. LED channel number display systems are relatively less complex and less expensive than on-screen channel number display systems, but have relatively small character size, require relatively large amounts of power, may distract from the picture because of their brightness and typically red color, and may not be readily visible under high ambient light conditions. Liquid crystal channel number display systems compare favorably because they are also relatively less complex and expensive than "on-screen" channel number display systems and, in addition, may have relatively large character size, require relatively insignificant amounts of power (e.g., the power consumption of liquid crystal displays is in the order of microwatts compared with the power consumption of LED displays which is in the order of milliwatts), tend not to distract from the picture and are readily visible under high ambient light conditions. Unfortunately, liquid crystal displays are not readily visible under low ambient light conditions.

To improve the visibility of liquid crystal display systems under low ambient light conditions, in such applications as liquid crystal watches, the liquid crystal display is often accompanied by an artificial light source. In some watch applications, a manually operable switch is provided by which the artificial light source may be selectively turned on. Such an arrangement can be relatively expensive in a television receiver environment. Moreover, the operation of the switch may tend to be inconvenient to viewers who typically sit at relatively remote locations from the receiver. While it may be possible in some applications, such as in watches, to utilize a low level radioactive light source which is continuously on with the liquid crystal display, for channel number display applications for which it is desirable that the channel numbers be as large as reasonably possible, the light source must be relatively large and bright to provide sufficient illumination, thereby necessitating the use of a lamp. Unfortunately, such lamps, when they are continuously on, require relatively large amounts of power and have relatively short lifetimes necessitating relatively frequent replacement.

SUMMARY OF THE PRESENT INVENTION

A television receiver includes a channel number display, such as a liquid crystal display, requiring external illumination and a light source is positioned on the receiver to illuminate the display. A light sensing arrangement is coupled to the source of light to control its light output in response to the ambient light level. The light sensing arrangement is also utilized to control at least one picture characteristic such as contrast, color level or brightness.

DETAILED DESCRIPTION OF THE DRAWING

Figure 1:
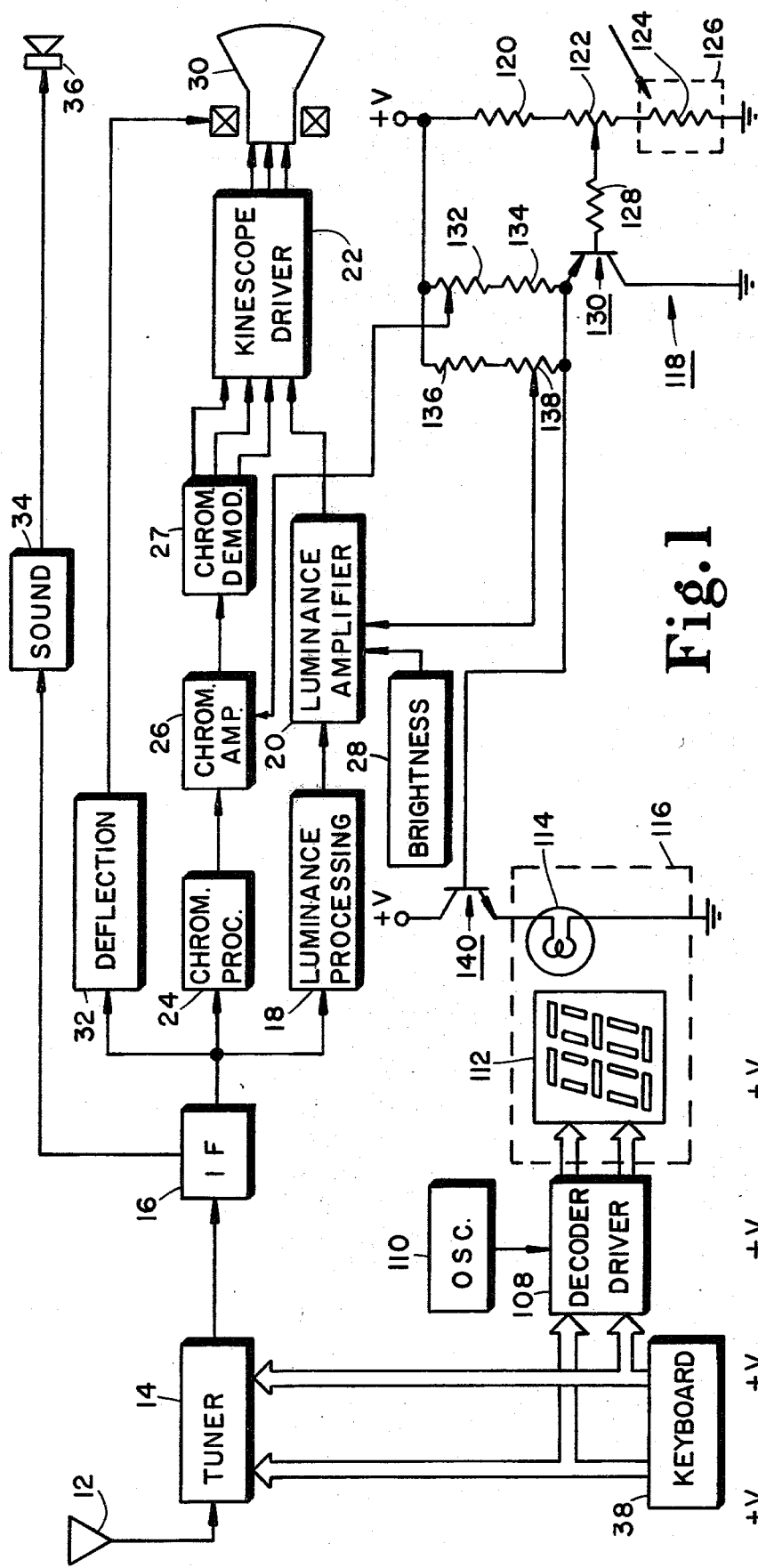
FIG. 1 shows a television receiver employing a liquid crystal channel number display arrangement constructed in accordance with the present invention.

In FIG. 1, a television receiver receives RF signals from an antenna 12. The RF signals are coupled to a tuner 14 where they are combined with a local oscillator signal having a frequency controlled in accordance with the channel selected by a viewer to produce an IF signal. The IF signal is coupled to an IF signal processing portion 16. A portion of the IF signal is coupled to a luminance processing circuit 18 which extracts luminance signals representing picture transition and tone from the IF signal. The luminance signals are amplified by a luminance amplifier 20 and coupled to a kinescope driver 22. Another portion of the IF signal is coupled to a chrominance processing circuit 24 which extracts chrominance signals representing picture color information from the IF signals. The chrominance signals are amplified by a chrominance amplifier 26. The amplified chrominance signals are demodulated by a chrominance demodulator 27 to form red, green and blue color difference signals. Kinescope driver 22 includes three amplifier arrangements (not shown) for combining the color difference signals with the luminance signals to produce color signals representing red, green and blue picture information. A brightness control unit 28 couples a DC signal to luminance amplifier 20 to control the DC component of the signal applied to the amplifier arrangements of kinescope driver 22 with respect to their cutoff points. The color signals are coupled to a kinescope 30 which, in response, produces three corresponding electron beams. Still another portion of the IF signal is coupled to deflection circuitry 32 which generates signals to control the horizontal and vertical deflection of the three electron beams to produce an image on the screen of kinescope 30. Sound signals derived from still another portion of the IF signal are processed by a sound processing unit 34 and converted to an audio resonse by a speaker 36.

The DC signal generated by brightness control unit 28 is controllable by means of a potentiometer (not shown) and is related to the black level or, as it is more conventionally referred to, the brightness of the image produced by kinescope 30. The gain of luminance amplifier 20 is controllable and is directly related to the contrast of the picture produced by kinescope 30. Similarly, the gain of chrominance amplifier 26 is controllable and is directly related to the color level of the reds, greens and blues in the picture. The gains of luminance amplifier 20 and chrominance amplifier 26 are controlled in inverse relationship to respective DC control signals generated by a control circuit 118. The black level, contrast and color level are directly related to the photometric brightness of the image produced by kinescope 30. As defined in the "LES Lighting Handbook", fourth edition, published by the Illuminating Engineering Society, photometric brightnes is: "the luminous flux per unit of projected area and unit solid angle either leaving a surface at a given point in a given direction or arriving at a surface in a given point from a given direction".

Specifically, control circuit 118 includes a resistor 120, a potentiometer 122 and a light dependent resistor 124 connected in series between a source of supply voltage +V and signal ground. Light dependent resistor 124 is mounted on an external portion 126 of the receiver to receive ambient room light. The wiper of potentiometer 122 is coupled through a resistor 128 to the base of a PNP transistor arranged in common emitter configuration. A potentiometer 132 and a resistor 134 are connected in series between supply voltage +V and the emitter of transistor 130. The wiper of potentiometer 132 is coupled to chrominance amplifier 26. A resistor 136 and a potentiometer 138 are also connected in series between supply voltage +V and the collector of transistor 130. The wiper of potentiometer 138 is connected to luminance amplifier 20.

In operation, as the level of ambient light decreases, the resistance of light dependent resistor 124 increases. As a result, the voltages developed at the wiper of potentiometer 122, the emitter of transistor 130 and the wiper arms of potentiometers 132 and 138 increase. Since luminance amplifier 20 and chrominance amplifier 26 have gains which are inversely related to the DC control signals generated by control circuit 118, the gains of luminance amplifier 20 and chrominance amplifier 26 decrease as the ambient light received by light dependent resistor 124 decreases. Conversely, as the ambient light increases, the gains of luminance amplifier 20 and chrominance amplifier 26 are increased. As a result, since the picture contrast is directly related to the gain of luminance amplifier 20 and the color intensity is directly related to the gain of chrominance amplifier 26, the contrast and color intensity are simultaneously controlled as a direct function of the ambient light. The gain tracking of the luminance and chrominance amplifier 26 is desirable to insure proper color reproduction under varying light conditions.

Potentiometer 138 allows for factory adjustment of the gain of luminance amplifier 20 to limit the maximum picture contrast under high ambient light conditions. Potentiometer 132 allows for viewer control of the color level relative to the contrast setting. Potentiometer 122 allows for simultaneous viewer control of both contrast and color level.

Various portions of the receiver described so far may comprise components similar to those disclosed in U.S. Pat. No. 3,961,361 and also in RCA Television Service Data, File 1976 C-4, for the CTC-74 series chassis, published by RCA Corporation, Indianapolis, Indiana, both hereby incorporated by reference.

Channels are selected by means of a keyboard 38. Keyboard 38 includes push buttons (not shown) corresponding to decimal digits 0 through 9. A viewer sequentially depresses the push buttons corresponding to the two decimal digits of the desired channel number. In response, a first group of four binary signals arranged in binary coded decimal (BCD) format representing the tens digit and a second group of four binary signals arranged in BCD format representing the units digit are generated by keyboard 38. Tuner 14 converts the binary signals representing the selected channel number to a local oscillator signal having the appropriate frequency for tuning the receiver to the selected channel. For this purpose, tuner 14 may include a phase locked loop tuning system of the type disclosed in U.S. Pat. No. 4,031,549, hereby incorporated by reference.

The binary signals representing the channel number are also coupled to a display decoder/driver 108. Display decoder/drive 108 converts the first and second groups of four binary signals each to third and fourth groups of seven signals each. The third and fourth groups of signals are coupled to the tens and units digit positions, respectively, of a two digit, seven-segment liquid crystal display unit 112 mounted within a display area 116 of the receiver. The seven signals in each of the fourth and fifth groups correspond to respective bar segments of corresponding digit positions. When the bar segments corresponding to a decimal digit are energized by the corresponding signals generated by decoder/driver 108, they are caused to reflect light. The number formed depends on which of the bar segments are energized. For example, the number 8 is formed when all the bar segments are energized. Since the lifetimes of liquid crystal displays are considerably shorter when energized by DC signals than when energized by AC signals, an oscillator 110, oscillating, for example at a frequency of 200 Hz, is coupled to decoder/driver 108 so that decoder/driver 108 provides AC energizing signals to liquid crystal display unit 112.

Liquid crystal display unit 112 may comprise a Model 3353 or Model 3233-9 available from VCE, Inc. and decoder/driver 108 may comprise a COSMOS CD4055 "Liquid Crystal Display Driver" available from RCA Corporation.

Normally, the light source for liquid crystal channel number display unit 112 is the ambient light, e.g., room light, surrounding the receiver. Under conditions of low ambient light conditions, e.g., during the evening, the ambient light provided to liquid crystal display 112 may be inadequate for the formation of readily visible channel numbers. To provide adequate light for liquid crystal display 112 under conditions of low ambient light, a source of light, e.g., a lamp, such as a No. 189 bulb available from General Electric Company, mounted in close proximity to liquid crystal display unit 112 within display area 116 of the receiver, is coupled to contrast and color control unit 118 to illuminate liquid crystal display 112 under conditions of low ambient light. Specifically, the emitter of transistor 130 is connected to the base of an NPN transistor 140 arranged as an emitter follower. The collector of transistor 140 is coupled to the source of supply voltage +V. Lamp 114 is connected between the emitter of transistor 140 and signal ground.

In operation, as the ambient light decreases, the impedance of light dependent resistor 124 increases. Correspondingly, the voltages at the emitter of transistor 130 and the base and emitter of transistor 140 increase. As a result, the current flowing through the collector-emitter junction of transistor 140 to lamp 114 increases and the light emitted by lamp 114 increases. Conversely, as the ambient light increases, the light output of lamp 114 is decreased. The resistance values of control circuit 118 are selected so that at a predetermined ambient light level, lamp 114 is extinguished.

It is noted that the present arrangement, wherein contrast and color level control circuitry 118 is also utilized to control lamp 114, avoids a separate ambient light control arrangement for liquid crystal display 112 and therefore is advantageous in that it comparatively reduces the number of parts utilized, with a resulting reduction in cost and improvement in reliability, and comparatively reduces the number of possible viewer adjustments.

Moreover, it is noted that in the arrangement of FIG. 1, the light provided to liquid crystal display 112 by lamp 114 is not only a function of the ambient light alone, but simultaneously also tracks adjustments of the contrast and color level of the picture whether automatically made by means of light dependent resistor 124 in accordance with the ambient light conditions or manually made by means of potentiometer 122 in accordance with a viewer's preference. As a result, a relatively fixed relationship is established between the photometric brightness of the picture, which is directly related to the contrast and color level of the picture, and the photometric brightness of liquid crystal channel number display 112. The benefit of this is that disconcerting photometric brightness differences between channel number display 112 and the picture which may distract a viewer's attention away from the picture are reduced. This would not be the case were artificial light source 114 controlled in response to a separate light sensing circuit.

Figure 2:
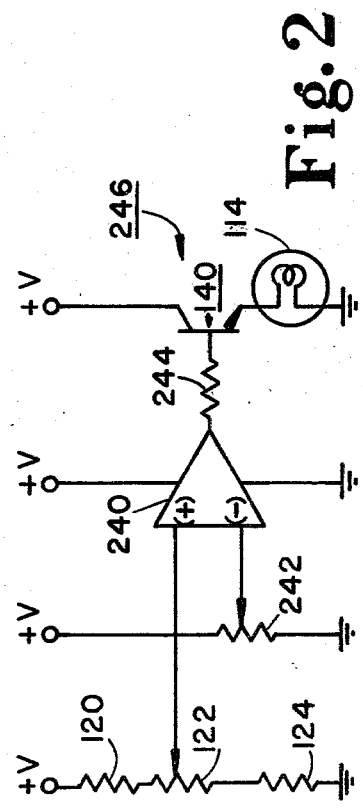
FIG. 2 shows in schematic form a modification of a portion of the liquid crystal channel number display arrangement shown in FIG. 1.

While, for the reasons set forth above, it may be desirable for the illumination of liquid crystal channel number display 112 to track the contrast and color level of the picture, it may be desirable for liquid crystal channel number display 112 to receive constant illumination from lamp 114 when the ambient light has fallen below a predetermined level. The circuitry shown in FIG. 2, which indicates elements also utilized in FIG. 1 with the same reference numbers, is arranged for this purpose. The structure of FIG. 2 is similar to the structure of FIG. 1 except that the wiper of potentiometer 122 is coupled to transistor 140 through a circuit including a comparator 240 instead of through transistor 130. The wiper of potentiometer 122 is connected to the positive (+) input of comparator 240. The negative (−) input of comparator 240 is connected to the wiper arm of a threshold setting potentiometer 242 coupled between supply voltage +V and signal ground. The output of comparator 240 is coupled through a current limiting resistor 244 to the base of transistor 140. In operation, lamp 114 will be illuminated only after a predetermined threshold voltage, determined by the setting of the wiper arm of potentiometer 242, is exceeded. Thereafter, the illumination of lamp 114 remains substantially constant with further decreases in the ambient light.

Although potentiometer 242 is provided to allow viewer adjustment of the ambient light threshold at which lamp 114 is illuminated, it may be replaced by a fixed resistive divider if desired.

While the channel number display apparatus of FIGS. 1 and 2 includes a control circuit 118 for controlling luminance amplifier 20 and chrominance amplifier 26, it should be noted that a control circuit for controlling other picture properties such as the black level or so-called brightness property by controlling the DC level coupled to kinescope driver 22 may also be employed. These and other modifications are intended to be within the scope of the present invention defined in the following claims.

What is claimed is:

1. In a television receiver including tuner means for processing RF signals received by the receiver in accordance with a selected channel to generate IF signals, signal processing means for processing said IF signals to generate luminance and color signals, and a kinescope for generating an image in response to said luminance and color signals, apparatus comprising:

channel number display means including a display element for indicating the channel number of a selected channel, said element being normally illuminated by ambient light in the environment of said receiver;

a source of artificial light positioned with respect to said channel number display means to illuminate said display element;

power supplying means for coupling power to said source of artificial light, the amount of power coupled to said artificial light source determining the amount of light emitted by said light source;

picture property determining means included in said signal processing means for determining at least one picture property directly related to the photometric brightness of said image produced by said kinescope; and control means including an ambient light sensing element and a setting element for generating a control signal representing the ambient light level in the environment of said receiver and a desired condition of said picture property;

said control signal being coupled to both said picture property determining means and to said power supplying means to control said picture property in direct relationship to said ambient light level and to control the light emitted by said artificial light source in inverse relationship to said ambient light level and in a predetermined relationship to said picture property.

2. The apparatus recited in claim 1 wherein: said channel number display includes a liquid crystal device.

3. The apparatus recited in claim 2 wherein: said channel number display means includes a seven segment liquid crystal array for each digit of said selected channel number.

4. The apparatus recited in claim 3 wherein: said control means includes manual means for also controlling the generation of said control signal.

5. The apparatus recited in claim 4 wherein: picture property determining means includes a luminance amplifier for amplifying said luminance signals to determine the contrast of said image and a chrominance amplifier for amplifying the chrominance signals to determine the color level of said image, both of said luminance and chrominance amplifiers having gains controlled in response to said control signal so that said contrast and said color level are directly related to said ambient light level.

6. The apparatus recited in claim 5 wherein:

said control means generates a control voltage inversely related to said ambient light level;

said power supplying means includes a DC amplifier having an input and an output, said control voltage being coupled to said input, said output being coupled to said source of artificial light, said DC amplifier being arranged so that the voltage developed at its output is directly related to said ambient light level.

7. The apparatus recited in claim 6 wherein:

said DC amplifier includes a transistor having base, emitter and collector electrodes, said control voltage being coupled to said base electrode, said emitter electrode being coupled to said source of artificial light, and said collector being coupled to a source of fixed voltage.

8. In a television receiver including means for processing RF signals received by the receiver in accordance with a selected channel to generate IF signals, signal processing means for processing said IF signals to generate luminance and color signals, and a kinescope for generating an image in response to said luminance and color signals, apparatus comprising:

channel number display means including a display element for indicating the channel number of a selected channel, said element being normally illuminated by ambient light in the environment of said receiver;

a source of artificial light positioned with respect to said channel number display means to illuminate said display element;

power supplying means for coupling power to said source of artificial light, the amount of power coupled to said artificial light source determining the amount of light emitted by said light source;

picture property determining means included in said signal processing means for determining at least one picture property directly related to the photometric brightness of said image produced by said kinescope; and control means including an ambient light sensing element and a setting element for generating a control signal representing the ambient light level in the environment of said receiver and a desired condition of said picture property;

said control signal being coupled to both said picture property determining means and to said power supplying means, said picture property determining means controlling said picture property in direct relationship to said ambient light level, said power supplying means including comparator means for comparing said control signal to a reference signal and energizing said source of artificial light only when said ambient light level falls below a predetermined level.

* * * * *

UNITED STATES PATENT AND TRADEMARK OFFICE
CERTIFICATE OF CORRECTION

PATENT NO. : 4,181,916
DATED : January 1, 1980
INVENTOR(S) : John Goodchilde Norie Henderson It is certified that error appears in the above-identified patent and that said Letters Patent is hereby corrected as shown below:

Col. 3, line 19, "LES" should be --IES..."--.
Col. 3, line 21, "brightnes" should be --brightness--.

Signed and Sealed this

First Day of April 1980

[SEAL]

Attest:

SIDNEY A. DIAMOND

Attesting Officer

Commissioner of Patents and Trademarks